United States Patent
Burger et al.

(10) Patent No.: US 7,594,314 B2
(45) Date of Patent: Sep. 29, 2009

(54) METHOD FOR BUILDING A DEVICE HAVING FLUIDIC AND ELECTRICAL FUNCTIONS

(75) Inventors: Gert-Jan Burger, Hengelo Ov (NL); Juriaan Vis, Enschede (NL); Harm Jan Van Weerden, Enschede (NL)

(73) Assignee: Concept to Volume B.V., Enschede (NL)

( * ) Notice: Subject to any disclaimer, the term of this patent is extended or adjusted under 35 U.S.C. 154(b) by 0 days.

(21) Appl. No.: 12/067,591

(22) PCT Filed: Mar. 22, 2007

(86) PCT No.: PCT/NL2007/000076

§ 371 (c)(1),
(2), (4) Date: Mar. 20, 2008

(87) PCT Pub. No.: WO2007/114687

PCT Pub. Date: Oct. 11, 2007

(65) Prior Publication Data

US 2008/0250633 A1    Oct. 16, 2008

(30) Foreign Application Priority Data

Mar. 30, 2006 (NL) .................................. 1031465

(51) Int. Cl.
*H01F 7/06* (2006.01)

(52) U.S. Cl. .................... 29/602.1; 29/605; 29/606; 156/153; 156/191; 156/193; 156/305; 310/43; 310/211; 310/216; 310/235; 335/297; 336/122

(58) Field of Classification Search ................ 29/602.1, 29/605, 606; 156/153, 191, 193, 305; 310/43, 310/211, 216, 235; 335/297; 336/122
See application file for complete search history.

(56) References Cited

U.S. PATENT DOCUMENTS

| 5,640,995 A | 6/1997 | Packard et al. |
|---|---|---|
| 6,293,012 B1 | 9/2001 | Moles |
| 6,540,961 B1 | 4/2003 | Ackley et al. |
| 2003/0061889 A1* | 4/2003 | Tadigadapa et al. ..... 73/861.355 |

(Continued)

FOREIGN PATENT DOCUMENTS

EP    1415710 A1    5/2004

(Continued)

*Primary Examiner*—Paul D Kim
(74) *Attorney, Agent, or Firm*—The Webb Law Firm

(57) ABSTRACT

A method for building a device having fluidic and electrical functions includes the steps of: mounting a building part with fluidic and electrical functions on a substrate that is provided with a fluidic circuit; fluidically connecting the building part with the substrate; electrically connecting the building part with the substrate; and mechanically connecting the building part with the substrate. Flip-chip technology is utilized and a seal is made by of a gasket. With such a method, a hybrid microfluidic system can be built in which materials and processes for realizing the various connections (fluidic and mechanical and electrical) can be selected in principle independently of each other so the individual processes can be optimized independently of each other in a large measure. With the application of flip-chip technology, great accuracy in the positioning of the building parts can be achieved.

9 Claims, 1 Drawing Sheet

U.S. PATENT DOCUMENTS

| | | |
|---|---|---|
| 2003/0096423 A1 | 5/2003 | Ryan et al. |
| 2004/0087043 A1 | 5/2004 | Lee et al. |
| 2006/0165565 A1* | 7/2006 | Ermakov .................... 422/130 |
| 2008/0178463 A1* | 7/2008 | Okubora ...................... 29/830 |
| 2008/0299013 A1* | 12/2008 | Trieu et al. .................. 422/104 |

FOREIGN PATENT DOCUMENTS

WO    2004022233 A1    3/2004

* cited by examiner

METHOD FOR BUILDING A DEVICE HAVING FLUIDIC AND ELECTRICAL FUNCTIONS

FIELD OF THE INVENTION

The invention concerns a method for building a device having fluidic and electrical functions, comprising:
mounting a building part with fluidic and electrical function on a substrate that is provided with a fluidic circuit;
fluidically connecting the building part with the substrate;
electrically connecting the building part with the substrate; and mechanically connecting the building part with the substrate.

With such a method hybrid microfluidic systems can be built.

BACKGROUND OF THE INVENTION

In the past decades many developments have taken place in the field of microfluidic systems. Important application fields are biochemical analysis and environmental measurements. With a certain application, production volume and complexity of the system concerned in mind, there is a choice of approaches for design and production. In case of smaller production volumes and bigger complexity a construction from separate standard components can be chosen, that are connected by means of metal, glass or plastic tubes, hoses and electric wires. The production may be labour-intensive and the dead volumes of the system will be rather large, but in a number of cases this may be the best approach, both economically and technically. For large production volumes it can be economically interesting to develop a made-to-measure solution. This made-to-measure solution consists preferably of a monolithic system and an integrated and automated production process. With the right design the internal dead volumes can be small. The development cost will be relatively high but the system and the production process can be fully optimised for this particular application.

For a medium sized production volume and a relatively complex system, one can choose for a hybrid solution, in which standard components are put together according to a purpose-designed, more or less generally usable process to make up the desired system. In this case one has the advantages of the use of standard components and a known process that can be used with minimal or no adaptations. A number of proposals has been made for such a hybrid solution, e.g. U.S. Pat. No. 5,640,995 and US 2004/0087043 and WO 2004/022233. The proposed processes however are not very generic, and besides that they generally cannot be sufficiently automated so the production remains relatively labour-intensive. Furthermore the precision required for mounting the components often can only be achieved with difficulty, if at all. Typical problems are leakage, obstruction of the channels by glue and the like, corrosion of the materials used by the applied liquids and contamination of the applied liquids and gases by the materials used.

In the building of a hybrid microfluidic system fluidic, electrical and mechanical connections must be made. The production requirements and functional requirements for these connections often are hard to reconcile. Known solutions are therefore characterised by compromises in the design and the choice of materials and processes. Ideally one would want to optimise each type of connection individually and be free to choose materials and processes. U.S. Pat. No. 6,540,961 describes a flow cell for (molecular biological) analysis and diagnostics comprising a first supporting substrate 102 (flex circuitry/PCB/semiconductive material) with fluidic and electr(on)ic components and a second substrate/flipped chip 112, which are mechanically connected by means of a sealant 130, and electrically connected by means of electrically conductive bumps 128. The sealant provides both a mechanical connection and a seal. Because both functions are not separated an independent optimisation of the fluidic connection and the mechanical connection is not possible. In EP 1415710 embodiments are described of a device for biochemical analysis, comprising one or more (DNA, RNA, protein) arrays. Among others, an integrated (microfluidic array) device 310 composed of one or more array components 312 and one or more microfluidic components 314 which are mutually connected mechanically and fluidically, but not electrically. An array component comprises one or more (flexible) array substrates 332 [0066]. An array component can be mechanically connected with a microfluidic component by means of clamps, clips or brackets and the like or by means of an adhesive, ultrasonic welding, etc. whereas the seal can be achieved by means of a gasket or sealant material [0071]. However no electrical connection is made in this way. A microfluidic component can comprise electrical features such as an electronics component/integrated circuit 512 [0091], in which the electronic component and the microfluidic component are mutually connected by means of a flip chip connection. [0094], but here no fluidic connection is made. The electronics component can also be mounted on top of a microfluidic feature such as a channel or chamber [102] but it is not indicated how a seal is made. In none of the mentioned documents making a mechanical and a fluidic and an electrical connection is described in which each can in principle be optimised independently from the others.

Consequently, there is a demand for a technology for building hybrid microfluidic systems from a set of more or less standard components that is as generic as possible and that can be automated in a large measure. The process and the materials should be as freely selectable as possible for each type of connection: fluidic, electrical and mechanical. The purpose of the present invention is to meet this demand.

SUMMARY OF THE INVENTION

To this end the present invention provides a method for building a device having fluidic and electrical functions, comprising:
mounting a building part with fluidic and electrical functions on a substrate that is provided with a fluidic circuit;
fluidically connecting the building part with the substrate;
electrically connecting the building part with the substrate; and
mechanically connecting the building part with the substrate.

characterised in that:
use is made of flip-chip technology; and
a seal is made by means of a gasket.

Flip-chip technology has been used for about forty years in all kinds of variants for the production of microprocessors, smart cards, watches, driver chips for LCDs etc. Thus it has become a very important packaging technology in the IC industry. Characteristically, a chip is mounted with its active side on a substrate. The electrical connection between the chip and the substrate is made by means of solder bumps, metallurgy bumps, compliant bumps, conductive polymers, anisotropically-conductive adhesives or clamp connections, see e.g. Rao Tummala, Fundamentals of Microsystems Packaging, 2002, ISBN 0-07-137169-9.

With such a method a hybrid microfluidic system can be built in which materials and processes for realizing the various connections can be selected in principle independently of each other so the individual processes can be optimised independently of each other in a large measure. With the application of flip-chip technology great accuracy in the positioning of the building parts can be achieved. The electrical connection is made by means of a current material and a well-developed process. Because in principle conventional, available equipment and technology can be used, development and production costs can remain low.

The substrate can be provided with a receiving space to at least partially receive the gasket. The receiving space helps to position the gasket. In a geometrically correct design—consider e.g. the depth of the receiving space and/or the height of distance pieces provided to that end—the gasket can be put under a well-defined stress by and during the mechanical connection. Consequently the seal is not dependent on e.g. the adhesion between the gasket and the building part or substrate. The gasket material can be e.g. an elastomer. The gasket can be manufactured in situ, e.g. by means of spinning or spraying, or ex situ e.g. by cutting the desired shape from sheet material.

The electrical connection can e.g. be achieved by means of stud bumps of gold that during the assembly are pressed against pads of gold. Dimensional variations can be evened out by the soft malleable gold. But also hard plated bumps or solder material can be used. Preferably the electrical components, present on or in the substrate and/or on or in the building part are isolated from the fluid present in the device by means of the gasket. In this way corrosion of the electrical parts by the fluid can be prevented, as well as contamination of the fluid and unwanted short-circuits.

In order to achieve a mechanical connection an auxiliary material with adhesive properties can be used, such as a glue, e.g. an epoxy glue. This allows quick and cheap processing. The auxiliary material can also be a solder, e.g. in high-temperature applications. But also clamping is possible, so the connection remains releasable, e.g. for testing, investigation or repair. Preferably the fluidic components, present on or in the substrate and/or on or in the building part, are isolated from the auxiliary material with the adhesive properties by means of the gasket. This way contamination and obstruction of the components in question can be avoided The gasket can also be used to form a flexible membrane. Thus e.g. a valve can be made. This will be further explained in the following description of embodiments of a method according to the present invention.

BRIEF DESCRIPTION OF THE FIGURES

The invention will be explained below by means of two non-limiting examples of embodiments of a method according to the invention.

In this.

EMBODIMENTS OF A METHOD ACCORDING TO THE PRESENT INVENTION

Figure 1:
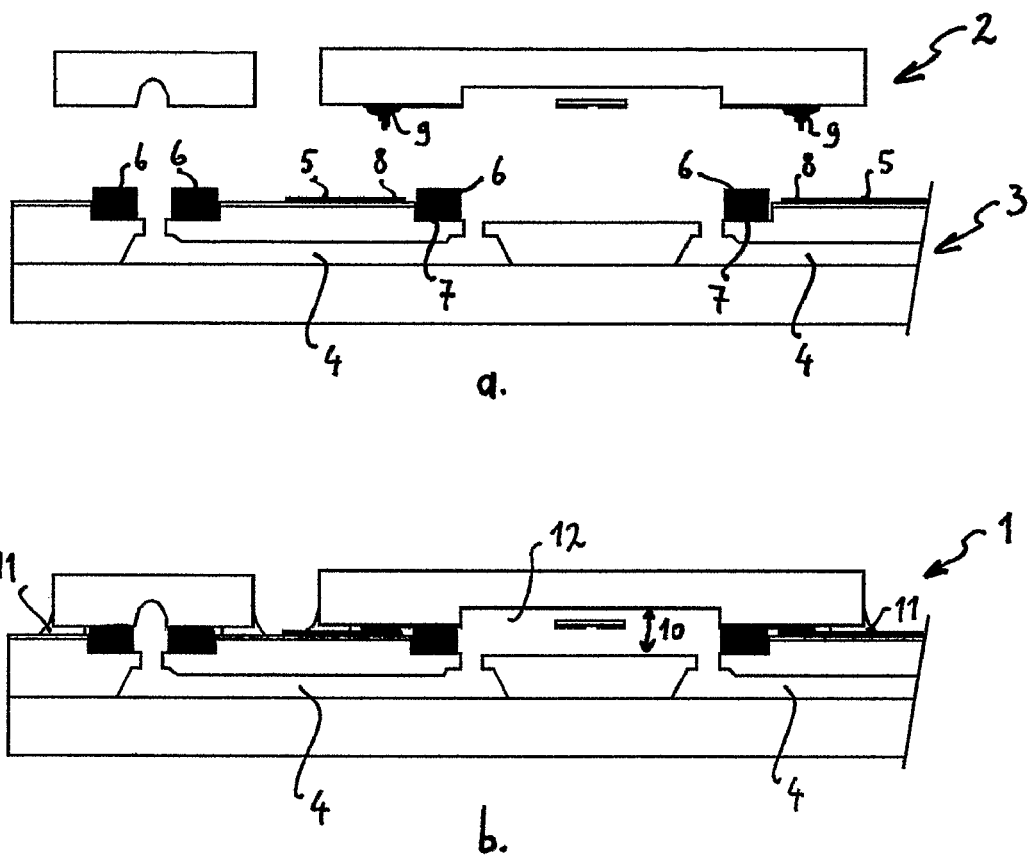
FIG. 1a shows a schematic cross-section of a part of a first device built according to a method of the present invention, during assembly.
FIG. 1b shows a schematic cross-section of the first device, after assembly.

A building part or module (2) is typically a chip of a glass or silicon base material, e.g. with lateral dimensions of 3×5 mm$^2$. The building part (2) can a.o. comprise a flow sensor, a pressure sensor, a valve, a pump, a reactor, an injector, a separation column, a heating element or a detector. A microfluidic device (1) is assembled by mounting the building part (2) and other required modules on a substrate or channel plate (3). Typically, the building part (2) needs to be positioned on the substrate (3) with a precision of 10 micron or less. With flip-chip technology this can be easily achieved. The substrate or channel plate (3) is typically a chip from a glass and/or silicon base material, with e.g. lateral dimensions of 20×30 mm$^2$, provided with a fluidic circuit (4) and an electrical circuit (5). The circuits (4,5) compose the connection between the building part (2) and an input or output of the device (1) or one or more other building parts mounted on the substrate (3). Typical dimensions of the channels (4) are squares of 25 to 250 micron.

An elastomer gasket (6) typically 100 microns thick is put in a recess (7) provided to this end in the surface of the substrate (3). The gasket can be solid or can be made of several parts. The thickness of the gasket (6) is large with respect to the production tolerances of the building parts, the assembly tolerances, effects of chemical or thermal nature and aging, so these can all be accommodated. The gasket can also be made in situ, e.g. by spraying or coating, as a whole or in parts.

The substrate (3) is also provided with gold pads (8) and the building part (2) with gold stud bumps (9) with a typical thickness of 50 micron. With this thickness, production tolerances can again be accommodated. During assembly the stud bumps (9) are pressed against the pads (8). If desired a stress or translation can be imposed, and thus the stress in the gasket (6) or, respectively, the height of the space concerned (10) can be determined. For the electrical connection a solder material or hard plated bumps with a conductive adhesive could also be used. The mechanical connection is provided by an adhesive (11), in this case an epoxy glue. For this also a soldering process, e.g. with gold and tin, can be used, e.g. when the thermal requirements are high.

The gasket (6) provides an isolation between the fluidic components (4,12) on the one hand and the electrical components (5,8,9) and the glue (11) on the other. Thus the liquids or gases that are used are protected against contamination, and the fluidic components (4,12) against contamination and obstruction. Also corrosion of the electrical components (5,8,9) by the fluids or gases used is prevented.

Figure 2:
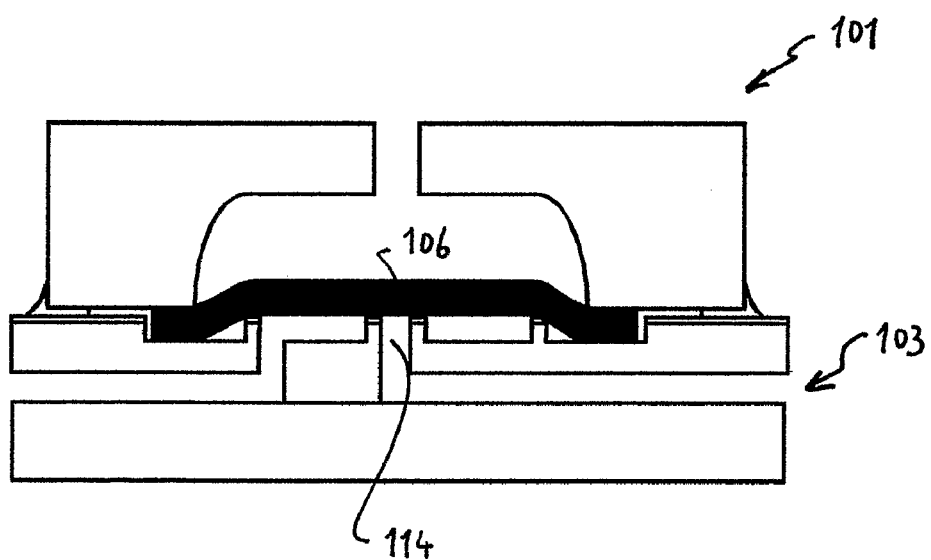
FIG. 2 shows a schematic cross-section of a part of a second device, built according to a method of the present invention.

A gasket can also serve as a flexible membrane (106) in e.g. a valve (101), see FIG. 2. To this end a substrate (103) is provided with a valve seat (114) against which a membrane (106) rests in the closed position of the valve (101). In a comparable fashion, one can also construct other hydraulic or pneumatic parts, e.g. a membrane pump.

A typical method according to the present invention comprises the following steps:
  preparation of the building parts or modules;
    cleaning;
    application of stud bumps;

preparation of the substrate or channel plate;
cleaning;
placing the substrate in the flip-chip machine;
placing the gasket(s) in the recesses provided in the substrate;
applying glue to the substrate;
positioning of a building part;
picking a building part up;
aligning the building part;
pressing the building part onto the substrate;
setting of the glue.

The whole process can be repeated, in series and/or parallel, for the required other building parts. Thus a complete microfluidic system can be assembled.

The advantages of such a method are among others:

the mechanical, electrical and fluidic connections can be optimised largely independently from each other;

with the relative thick gasket or gaskets, production tolerances, assembly tolerances, chemical or thermal effects and aging can be accommodated;

the possibilities of precise manufacture of the gaskets and the fluidic circuit on the substrate, and the accuracy of positioning the building parts on the substrate yield minimal internal dead volumes;

because conventional flip-chip equipment can be used the required investment is low;

the use of known flip-chip technology increases reliability and yield and reduces development and production costs considerably; and thanks to the generic character of the process, changing the production line can be done swiftly and cheaply.

It will be evident that the invention is in no way limited to the provided embodiments and that many variants are possible within the scope of the invention.

The invention claimed is:

1. A method for building a device having fluidic and electrical functions, comprising the steps of:
    mounting a building part with fluidic and electrical functions on a substrate that is provided with a fluidic circuit using flip-chip technology;
    fluidically connecting the building part with the substrate;
    electrically connecting the building part with the substrate; and
    mechanically connecting the building part with the substrate, wherein
    a seal is provided between the building part and the substrate made by means of a gasket.

2. The method according to claim 1, wherein the mechanical connection is made of an auxiliary material with adhesive properties.

3. The method according to claim 2, wherein for the auxiliary material with adhesive properties a glue is used.

4. The method according to claim 2, wherein for the auxiliary material with adhesive properties a solder material is used.

5. The method according to claim 2, wherein fluidic components are isolated from the auxiliary material with adhesive properties by means of the gasket.

6. The method according to claim 1, wherein the substrate is provided with a receiving space to receive the gasket at least partially.

7. The method according to claim 1, wherein the gasket is put under stress by and during the mechanical connection step.

8. The method according to claim 1, wherein the gasket is also used to form a flexible membrane.

9. The method according to claim 1, wherein electrical components are isolated from a fluid present in the device by means of the gasket.

* * * * *